(12) United States Patent
De Mol et al.

(10) Patent No.: US 7,916,275 B2
(45) Date of Patent: Mar. 29, 2011

(54) METHODS OF CHARACTERIZING SIMILARITY OR CONSISTENCY IN A SET OF ENTITIES

(75) Inventors: Christianus Gerardus Maria De Mol, Son en Breugel (NL); Maria Elisabeth Reuhman-Huisken, Waaire (NL)

(73) Assignee: ASML Netherlands B.V., Veldhoven (NL)

( * ) Notice: Subject to any disclaimer, the term of this patent is extended or adjusted under 35 U.S.C. 154(b) by 765 days.

(21) Appl. No.: 11/902,186

(22) Filed: Sep. 19, 2007

(65) Prior Publication Data

US 2009/0073403 A1    Mar. 19, 2009

(51) Int. Cl.
  *G03B 27/42* (2006.01)
  *G03B 27/58* (2006.01)
  *G03B 27/32* (2006.01)
  *G01N 21/00* (2006.01)

(52) U.S. Cl. ............ 355/53; 355/72; 355/77; 356/237.5

(58) Field of Classification Search ............ 355/52, 355/53, 72, 77; 430/30; 356/237.4, 237.5; 702/150; 706/52
See application file for complete search history.

(56) References Cited

U.S. PATENT DOCUMENTS

| 5,191,200 A | 3/1993 | van der Werf et al. |
| 6,521,385 B2 * | 2/2003 | Yoshida et al. ................. 430/22 |
| 2003/0170552 A1 * | 9/2003 | Miyashita et al. .............. 430/30 |
| 2006/0279720 A1 * | 12/2006 | Sekigawa et al. .............. 355/69 |
| 2008/0106714 A1 * | 5/2008 | Okita .............................. 355/53 |

OTHER PUBLICATIONS

De Mol et al., "Methods of Characterizing Similarity Between Measurements on Entities, Computer Programs Product and Data Carrier", U.S. Appl. No. 12/233,484, filed Sep. 18, 2008.

* cited by examiner

*Primary Examiner* — Alan A Mathews
(74) *Attorney, Agent, or Firm* — Sterne, Kessler, Goldstein & Fox P.L.L.C.

(57) ABSTRACT

A method of characterizing the similarity between entities in a set of entities, wherein an entity is selected from substrate layers, substrate fields and substrates. Including determining positions at a plurality of measurement points per entity for providing position data; computing a correlation coefficient for each of a plurality of combinations of entities from the entity set, the correlation coefficients being based on the position data and being representative of the correlation between the associated combination of entities; comparing the correlation coefficients to a threshold amount to determine the extent of similarity between the entities. The invention also relates to a similar method incorporating determining an average value of the computed correlation coefficients, the average value providing a measure of the consistency.

31 Claims, 5 Drawing Sheets

METHODS OF CHARACTERIZING SIMILARITY OR CONSISTENCY IN A SET OF ENTITIES

FIELD

The present invention relates to a method of characterizing the similarity between a plurality of entities in a set of entities, wherein an entity is selected from the group including substrate layers, substrate fields and substrates, and a method of characterizing the consistency between a plurality of such entities. The invention also relates to a lithographic apparatus, a computer arrangement, a computer program product and a data carrier encoded with such computer program product.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Manufacturing a typical device by a lithographic process typically includes a plurality of cycles of a variety of steps. These steps may include coating the substrate with a photosensitive material (or otherwise applying a photosensitive material to one or more surfaces of the substrate), projecting an image on the photosensitive material, developing the photosensitive material and processing the substrate, which can include covering the substrate in a new layer of material. One of the problems that may be encountered with the lithographic process is that successive layers are not accurately imaged on top of each other so that there is a so-called overlay error. In order to avoid proceeding onto the subsequent steps when an overlay error already exists which would be detrimental to the component's performance, after each cycle the overlay error may be measured. If the overlay error is too large then the most recent layer can be removed and that step repeated before proceeding onto the next step.

In order to reduce overlay error, substrates are generally provided with a plurality of reference marks so that the position of the substrate on a substrate table in a projection apparatus may be measured very precisely prior to the exposure operation. In this way it is possible to improve the accuracy of the exposure operation because the relative positions of the substrate, the previously applied patterned layer and the patterning device in the lithographic apparatus may be determined.

Another problem with multi-cycle lithographic processes is the deformation of the substrate which can occur with the application of particular layers and/or particular patterns. Deformation includes, for example, topographic 3-dimensional deformation, deformation of the reference marks (shape or depth) or variation of layer properties or thicknesses deposited on the substrate. Chemical mechanical polishing (CMP) is notorious for causing deformation of the substrate. With the use of substrates with a diameter of 300 mm or more, it is expected that substrate deformation may become an even more important factor. In order to reduce deformation, it may be desirable to keep the processes as uniform as possible over the whole area of the substrate. Deformation of the substrate may lead to errors in the imaging of the substrate resulting in the need to repeat a particular operation. Also, during the development of a process for a particular component manufactured by lithography, the process may be optimized to minimize, or at least keep within limits, the amount of substrate deformation. The reduction of overlay error or an error as a result of substrate deformation, or at least early detection of one or more of such errors, may lead to improved yield.

Small particles present on the surface of the substrate may hamper the lithographic process since at the positions of the particles no proper illumination of the substrate can be achieved. Generally the size of the particles is such that they cannot be detected by the level sensors present in the lithographic apparatus, but they may be detected when more accurate level sensors are employed, for instance in dedicated measurement equipment of the manufacturer of the substrate.

Small particles may also be present between the substrate carrier, i.e., the support table or chuck, and the substrate. These particles may deform the layers before the lithographic process is performed. The particles cause artifacts, so-called focus spots, in the subsequent layers arranged at the surface of the substrate. When the artifacts are positioned beneath an alignment mark, they may give rise to overlay errors as well. A timely detection of the artifacts, i.e., a detection before the next layer is applied on the substrate, may lead to an improved yield.

One option would be to measure the substrate at least parts of the grids and/or substrate shapes of a number of substrates in separate (off-line) measuring instruments (metrology tools) or on-line in the lithographic apparatus itself, just before a pattern is to be applied on the substrate, and show the results of the measurements in graphical representations. The graphical representations may be analysed and interpreted by a human operator. However, an interpretation based on graphical representations of the measured substrate grid and shape is rather subjective and time-consuming and does not provide a workable situation for defining substrate-shape, substrate-grid and substrate field-shape consistency given the huge amount of measurement data. This hampers process characterization, criteria for transfer to production, and production quality monitoring.

SUMMARY

It may be useful to provide a method and apparatus that allow for an efficient characterization of the similarity between a plurality of entities in a set of entities, wherein an entity is selected from the group consisting of substrate layers, substrate fields and substrates.

It may also be useful to provide a method and apparatus that allow for an efficient characterization of the consistency between a plurality of entities in a set of entities, wherein an entity is selected from the group including substrate layers, substrate fields and substrates.

According to an aspect of the invention, there is provided a method of characterizing the similarity between a plurality of entities in a set of entities, wherein an entity is selected from the group including substrate layers, substrate fields and substrates, the method including determining lateral and/or height positions at a plurality of measurement points per entity for providing position data, computing a correlation coefficient for each of a plurality of combinations of entities from the entity set, the correlation coefficients being based on the position data and being representative of the correlation between the associated combination of entities, and comparing the correlation coefficients to a threshold amount to determine the extent of similarity between the entities.

According to an aspect of the invention, there is provided a method of characterizing the consistency between a plurality of entities in a set of entities, wherein an entity is selected from the group including substrate layers, substrate fields and substrates, the method including determining lateral and/or height positions at a plurality of measurement points per entity for providing position data, computing for each entity in the entity set a correlation coefficient with respect to every other entity in the entity set, the correlation coefficients being based on the position data and being representative of the correlation between the associated combination of entities, and determining an average value of the computed correlation coefficients, the average value providing a measure of the consistency.

According to another aspect of the invention, there is provided a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate and a projection system configured to project the patterned radiation beam onto a target portion of the substrate, at least one position sensor for determining lateral and/or height positions at a plurality of measurement points on a substrate for providing position data, wherein the lithographic apparatus is construed and arranged to characterize the similarity between a plurality of entities in a set of entities, wherein an entity is selected from the group including substrate layers, substrate fields and substrates, by determining the position data at a plurality of measurement points per entity for providing position data, computing a correlation coefficient for each of a plurality of combinations of entities from the entity set, the correlation coefficients being based on the position data and being representative of the correlation between the associated combination of entities, comparing the correlation coefficients to a threshold amount to determine the extent of similarity between the entities.

According to another aspect of the invention, there is provided a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, at least one position sensor for determining lateral and/or height positions at a plurality of measurement points on a substrate for providing position data, wherein the lithographic apparatus is construed and arranged to characterize the consistency between a plurality of entities in a set of entities, wherein an entity is selected from the group consisting of substrate layers, substrate fields and substrates, by determining lateral and/or height positions at a plurality of measurement points per entity for providing position data, computing for each entity in the entity set a correlation coefficient with respect to every other entity in the entity set, the correlation coefficients being based on the position data and being representative of the correlation between the associated combination of entities, determining an average value of the computed correlation coefficients, the average value providing a measure of the consistency.

According to another aspect of the invention, a computer arrangement is provided including a processor for performing arithmetical operations, and a memory, the computer arrangement being constructed and arranged to communicate with at least one position sensor for determining lateral and/or height positions at a plurality of measurement points on a substrate for providing position data and the processor being arranged to read and execute programming lines stored in memory providing the processor with the functionality to perform any of the above methods.

According to another aspect of the invention, a computer program product is provided including instructions and data to allow a processor to run a predetermined program in accordance with any one of the above methods.

According to another aspect of the invention, there is provided a data carrier or machine readable medium including, that is, encoded with, a computer program product, or machine readable and executable instructions according to the above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
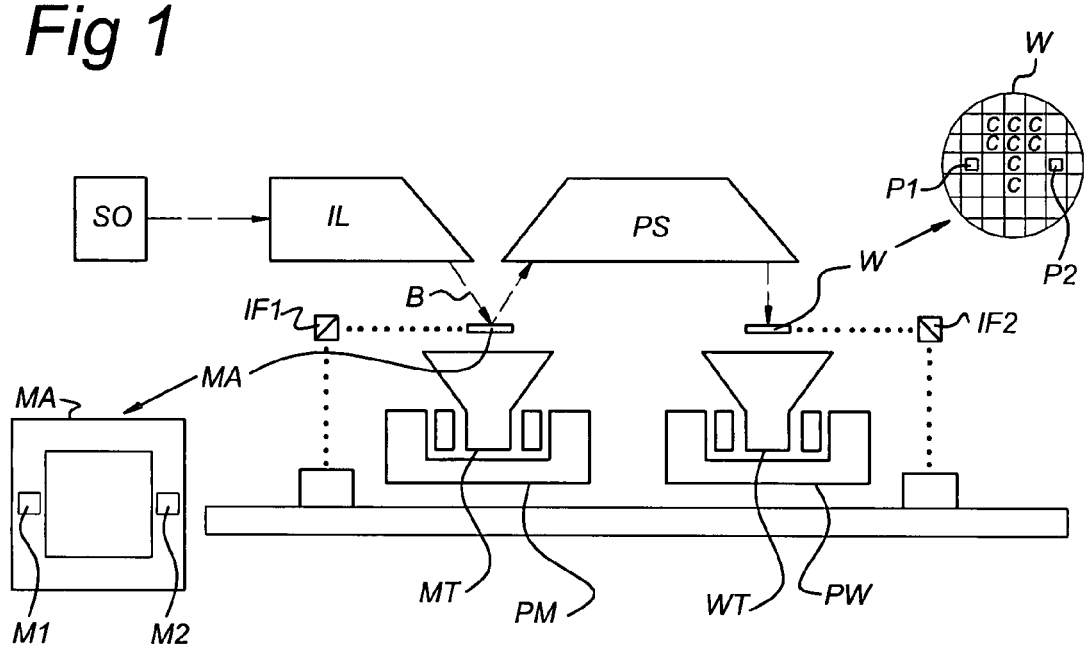
FIG. 1 depicts schematically a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In a typical dual stage lithographic projection apparatus the number of substrate reference marks or alignment marks might be about 25 per substrate W. For reasons of clarity a smaller number of marks is shown in FIG. 1.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
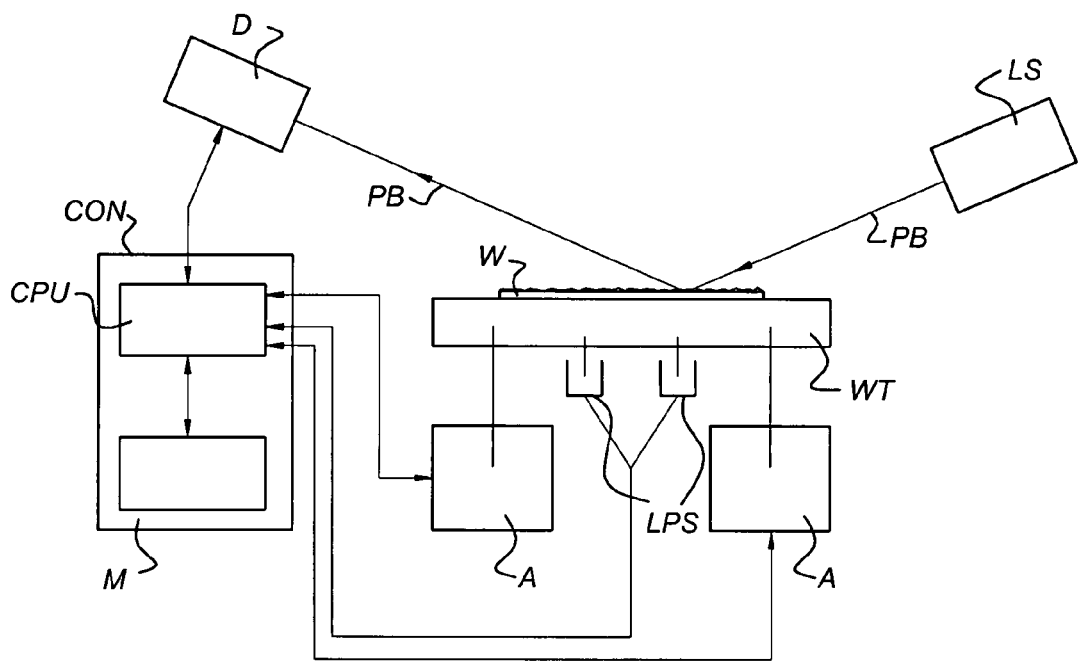
FIG. 2 depicts schematically the measurement station region of the lithographic apparatus of FIG. 1.

In FIG. 2, a further view of the measurement station region of the lithographic apparatus of FIG. 1 is given. The position sensor IF2 shown in FIG. 1 measures at a number of measurement points, for instance at the alignment marks (P1,P2) shown in FIG. 1, the lateral positions (x,y-coordinates) and the height positions (z-coordinate) of the substrate W placed on the substrate table WT. The substrate table WT is connected to actuators A that may be part of the second positioner PW (not shown in FIG. 2). These actuators are connected to a control device CON with a processor CPU and a memory M. The processor CPU further receives information from lateral position sensors LPS (part of the position sensor IF2) measuring the position of the substrate table WT or substrate table holder by electric (capacitive, inductive) or optical, e.g., interferometric (as shown in FIG. 1) devices. The processor also receives input from a level sensor LS which measures the height and/or tilt information from the target area C on the substrate W where the projection beam PB hits the substrate surface. The level sensor LS may be, for example, an optical sensor as described here; alternatively, a pneumatic or capacitive sensor (for example) is conceivable.

The term height as used herein refers to a direction substantially perpendicular to the surface of the substrate W, i.e., substantially perpendicular to the surface of the substrate W that is to be exposed. The level sensor LS measures the vertical position of one or more very small areas generating height data. The level sensor LS may comprise a light source (not shown) for producing a light beam B, projection optics (not shown) for projecting the light beam B onto the substrate W, detection optics (not shown) and a sensor or detector D. The detector D generates a height dependant signal, which is fed to the processor. The processor is arranged to process the height information and to construct a measured height map, which may be stored into memory M.

An example of a procedure for measuring height data in a projection apparatus is described in U.S. Pat. No. 5,191,200. This procedure may be performed during exposure (on-the-fly), by measuring the part of the substrate W that is being exposed or is next to be exposed, but the surface of the substrate W may also be measured in advance. This latter approach may also be done at a remote position, for instance in a separate measuring instrument. In the latter case, the results of the level sensor measurements may be stored in the form of a so-called height map or height profile and used during exposure to position the substrate W with respect to the focal plane of the optical elements.

The measurements of a level sensor D result in a height data, comprising information about the relative heights of specific positions of the substrate W. This may also be referred to as a height map. Based on this height data, a height profile may be computed, for instance by averaging corresponding height data from different parts of the substrate (e.g., height data corresponding to similar relative positions within different target portions C). In case such corresponding height data is not available, the height profile is equal to the height data. Based on height data or a height profile, a leveling profile may be determined, being an indication of an optimal positioning of the substrate W with respect to a projection system PS. Such a leveling profile may be determined by applying a linear fit through (part of) the height data or the height profile, e.g., by performing a least squares fit (three dimensional) through the points that are inside the measured area.

As explained above, accurate leveling may require measuring the shape (z-positions) and topography (x,y-positions) of the substrate, for instance using a level sensor, resulting in a height data of (at least part) of the substrate W, based on which a leveling profile can be determined. Such a leveling profile may represent the optimal position of the substrate W with respect to the projection system PS, taking into account the local shape and height of the substrate W.

Figure 3:
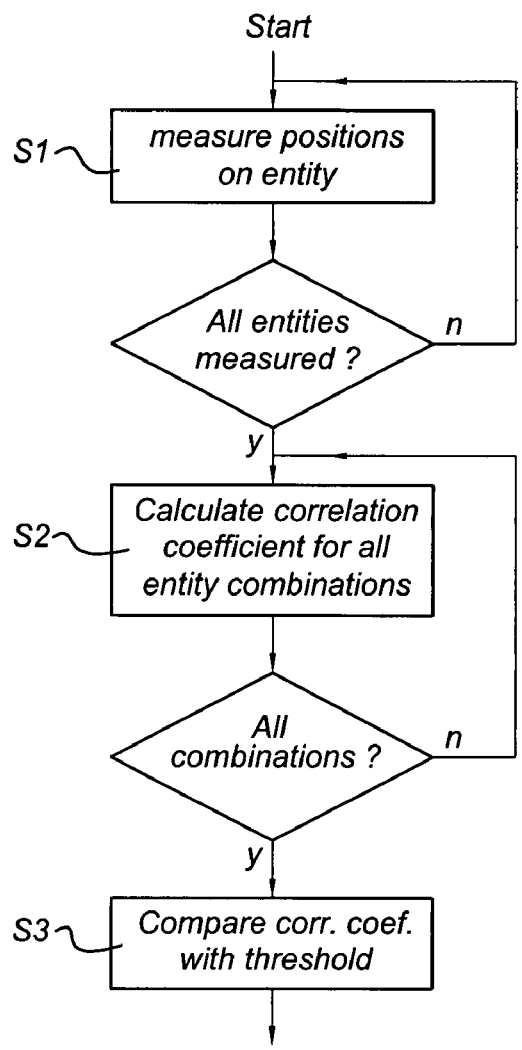
FIGS. 3-6 are schematic illustration showing various operations of a method according to different embodiments of the present invention.

FIG. 3 illustrates the operations of an embodiment of the method. The first operation of the method is a measurement operation (S1). The measurement operation involves measuring the lateral positions of each or some of the alignment marks or reference marks (P1, P2) on a substrate W are measured. Alternatively or additionally the measurement operation involves measuring the height positions of the substrate surface. Generally the height positions are measured at measurement points distributed over essentially the entire surface of the substrate. The measurement points may partially or entirely coincide with the alignment marts or reference marks. Generally, however, the measurement points differ from the alignment marks or reference marks, especially when the latter marks are arranged at the grid lines of the substrate. The measurement operations may be performed in the lithographic projection apparatus, where the position of the reference marks may be measured in any case for substrate W to substrate table WT alignment and leveling measurement, or it can be performed in a separate machine.

During the measurement operation (S1) the measuring system measures the relative height positions (z-direction, substantially perpendicular to the surface of the substrate the pattern is to be applied to) and/or the lateral positions (x,y-directions, substantially perpendicular to the z-direction and to each other) of the entity to be measured. The entity may be the substrate itself or a part thereof, such as one or more specific substrate fields of a substrate. The measurements of the positions are performed at a plurality of measurement points, in this example the reference marks on the substrate W.

The above-mentioned measurement operation (S1) of the relevant positions of reference marks is repeated for all substrates of a given lot, i.e., substrates that are to be subjected to the same operations in the projection device, if it is intended to characterize the quality of the substrates in a lot. If, on the other hand, it is intended to characterize the substrates of a given support table, i.e., the substrates that have been processed or will be processed by the same support table (also referred to as the wafer table or chuck) of the projection device, the operation of measuring the positions (x,y,z) at the measurement points is repeated for all substrates assigned to the specific support table.

More generally, a set of substrates is measured, which enables the characterization of the substrates in the substrate set or in a subset thereof. In practice the measurement may often be performed for a lot, so that it is possible the determine the quality of the substrates of the lot (set) or the quality of a subset of the lot, for instance the quality of substrates handled by one of the chucks of the lithographic device.

It is also possible to perform the characterization for the various fields on the same substrate. In this case the operation of measuring the positions at the measuring points is repeated for a plurality of the fields of the substrate.

Although in the above-mentioned measurement operation (relative) positional information of the substrate(s) is measured, the operation may involve measurement of any kind of data relating to the substrate in general and/or to the particular layer of concern, as well as statistical measures. For example, the information may comprise raw position data; raw sensor data indicative of the substrate markers; and/or calculations from the data, such as magnification, translation, rotation or differences of individual measurements with respect to a reference grid described by parameters. In the following description of an embodiment of the invention referral will be made to the residual (position) data that correspond to the deviation of the difference between the measured position data and the expected position data (hereafter referred to as $\Delta$) and a regression model.

One of the statistical methods of identifying discrepant substrates may use linear regression analysis based on the following model:

$$\Delta = \beta_0 + \beta_1 x + \beta_2 y + \text{residual data}$$

where $\Delta$ is the difference between measured position data and the expected position data in (x,y,z). This model is for instance applied when the measured position data is composed of fine wafer align (FIWA) data (i.e., representative of the lateral positions) taken at various measurement points across the substrate and z-map data (representative of the height positions), which comprises one average height position per substrate field, i.e., the average of all measured heights available in the respective substrate field. If the measured position data is composed of z-map data (representative of the height positions) taken at several measurement points per substrate field, generally another regression model may be used:

$$\Delta = \beta_0 + \beta_1 x + \beta_2 y + \beta_3 x^2 + \beta_4 y^2 + \beta_5 xy + \text{residual data}$$

wherein $\Delta$ is again the difference between measured position data and the expected position data in (x,y,z). In general the model fit is not perfect, which will result in a residual data for each measurement. This residual data can be thought of to consist of two components: a so-called non-correctable component and a random component. The non-correctable component is a constant that, by definition, cannot be described by the model applied. The random component, which may also be referred to as measurement noise, consists of real measurement-device related noise and, for example, of random variation in the quality of the measurement targets.

A variance ($\sigma^2$) of the measurement noise can be used as a measurement of a reliability of the estimated model parameters. Furthermore, the noise level also affects the quality of the measurements. As a result, by estimating the variance and determining a sensitivity of the variance to changing conditions, a useful metric can be obtained.

In practice multiple linear regression is applied to a number of entities, where an entity might be a substrate containing multiple position measurements of multiple substrates per batch or lot. Therefore modeling substrate data will result in a residual for each measurement position. By averaging the residual data for each measurement over all substrates an estimate is obtained of the non-correctable error of that position. In the event of a process change, an error such as a particle on the substrate table, or a layer-to-layer interaction, the pattern of the non-correctable errors will change and can be detected.

An estimate of the variance of the measurement noise can be obtained. For example, this quantity may be estimated by summing residual-variances from each of a number of measurement positions (n) in each measurement entity (m), and dividing the result by n−(k+1), where the quantity k+1 is a number of parameters used in the model. Defining $res_{i,j}$ as being a residual at the position i in the entity j a formula for estimating $\sigma^2$ is as follows:

$$\hat{\sigma}^2 = \frac{1}{n-k-1} \sum_{i=1}^{n} \left( \frac{1}{m-1} \sum_{j=1}^{m} \left( res_{i,j} - \frac{1}{m} \sum_{k=1}^{m} res_{i,k} \right)^2 \right)$$

The reliability or confidence interval of the estimated standard deviation (the square root of the estimated variance) can be expressed as follows:

$$\frac{\hat{\sigma}}{\sigma} = 1 \pm z_{\alpha/2} \cdot c$$

wherein $\hat{\sigma}$ is the estimated standard deviation, $\alpha$ represents the confidence level (e.g., $\alpha$=0.05 for 95% confidence level), $Z_{\alpha/2}$ is the z value for which the probability $P(z \leq Z_{\alpha/2})$ equals $1-\alpha/2$, which probability can be obtained from the standard normal distribution table, and c is determined by $$c = \frac{1}{\sqrt{2(m-1)(n-k-1)}}.$$

The above expressions hold for situations in which the random component is nearly normal. However, as the distributions become more platykurtic (that is, the distributions vary from normal, but kurtosis is relatively small, where kurtosis is a parameter derived from the mean and $\sigma$), then c tends to be smaller and the reliability defined above tends closer to 1.

Suppose we have two datasets ($set_1$, $set_2$) representing the residual data associated with a first entity (for instance a first substrate) and a second entity (for instance a second substrate):

set$_1$={Z$_1$(1), ..., Z$_1$(j), ..., Z$_1$(n)} set$_2$={Z$_2$(1), ..., Z$_2$(j), ..., Z$_2$(n)}

As a measure for the similarity between these datasets a correlation coefficient may be calculated (S2, FIG. 3). In an embodiment the correlation coefficient ($r_{1,2}$) between the first entity having position data $Z_1(j)$ and the second entity having position data $Z_2(j)$ may be defined by:

$$r_{1,2} = \frac{\sum_{j=1}^{n}[(Z_1(j)-\bar{Z}_1)(Z_2(j)-\bar{Z}_2)]}{\sqrt{\sum_{j=1}^{n}(Z_1(j)-\bar{Z}_1)^2 \sum_{j=1}^{n}(Z_2(j)-\bar{Z}_2)^2}}$$

wherein:

$$\bar{Z} = \frac{1}{n}\sum_{j=1}^{n} Z(j)$$

and n is the total number of measurement points.

Once the correlation coefficient $r_{1,2}$ between the residual position data from the first and second set has been determined, the coefficient is compared (S3) to a threshold amount to determine the extent of similarity between the entities. In case of more than two sets of residual position data, two or more correlation coefficients may be calculated and compared to the threshold amount in order to determine the extent a data set is, similar to each of the other data sets.

Figure 4:
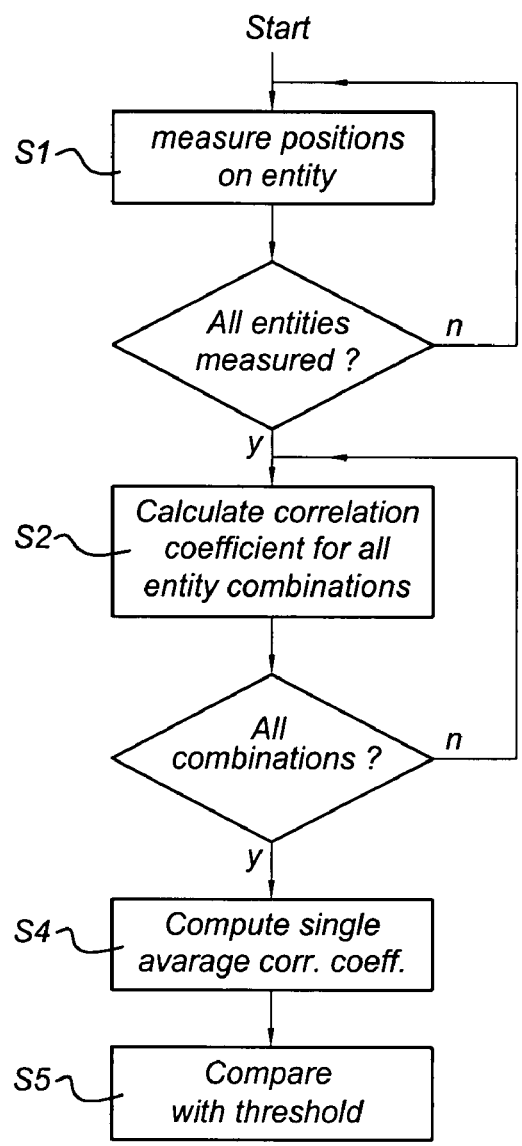

In FIG. 4 another embodiment of the invention is elucidated. Suppose, for instance, we have a plurality (m) of datasets (set$_i$), each comprising position data $Z_i(j)$ associated with an entity, for instance a substrate, taken from an entity set, for instance a lot, that is:

set$_i$={Z$_i$(1), ..., Z$_i$(n)} i=1, ..., m then for each entity in the entity set the correlation coefficients with respect to every other entity in the entity set may be calculated. Averaging these correlation coefficients for the entity set gives a measure for the consistency within the entity set.

In an embodiment of the invention one average value of all computed correlation coefficients is determined (S4, FIG. 4) in order to have a single number indication on how similar the entities in the entity set are in shape and/or grid. An example of an expression for the determination of an average correlation coefficient for the entire entity set is given by:

$$\bar{r} = \frac{2}{m(m-1)}\sum_{i=1}^{m-1}\sum_{j=i+1}^{m} r_{i,j}$$

with $\bar{r}$ r the average correlation coefficient.

The average correlation coefficient of the entity set is compared (S5) to a threshold amount. If the correlation coefficient is larger than the threshold value, it is determined that the various entities in the entity set have a large consistency, whereas it is determined that the entities lack sufficient consistency when the average correlation coefficient remains lower than the threshold value. In the latter case the entities can be rejected, otherwise they are accepted as sufficiently consistent.

As mentioned earlier, in case the entities are substrates to be processed by the projection device and the entity set comprises substrates from a lot that are to be subjected to the same operations in the projection device, the above procedure provides a measure for the lot consistency. In case the entities are substrates to be processed by a projection device and the entity set comprises substrates to be carried by the same support table of the projection device, the procedure provides a measure for the support table consistency (also referred to as wafer table consistency or the chuck consistency). In case the entities are fields of a substrate to be processed by a projection device and the entity set comprises the fields of said at least one substrate, the procedure provides for a measure of the field consistency of the specific substrate. The entities may also be formed by the different layers of a substrate. In this case the procedure provides a measure for the inter-layer consistency.

Figure 5:
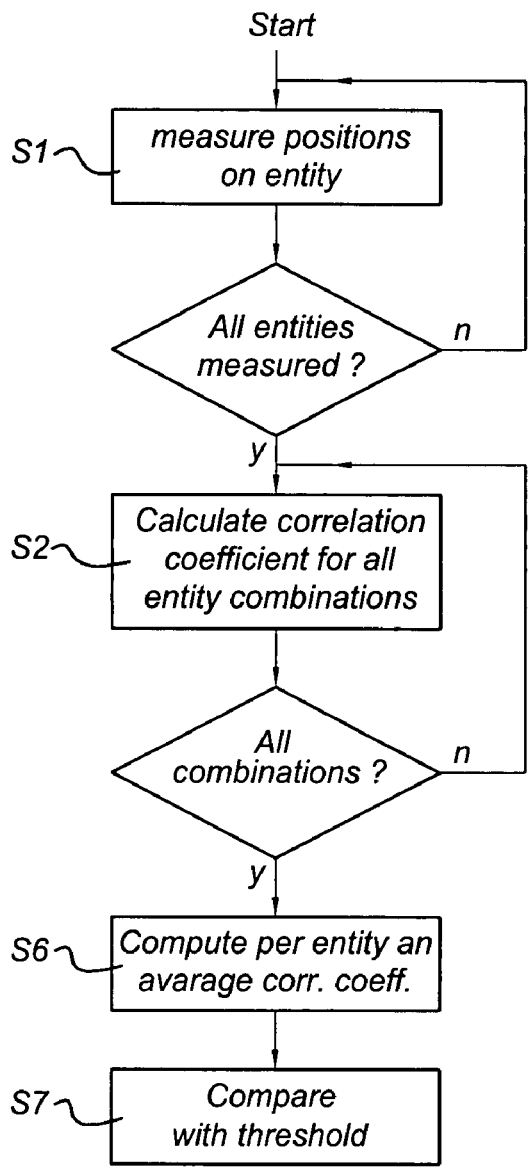

In another embodiment (the operations of which are schematically shown in FIG. 5) an average correlation coefficient per entity is calculated (S6). For instance, if the entity set is comprised of a plurality of substrates of the same product lot (typically 25 wafers), then for each substrate (wafer) the correlation coefficient with respect to each of the other substrates (wafers) of the lot is calculated. The calculated correlation coefficients associated with a specific substrate are then averaged and this procedure is repeated for all substrates. An example of an expression for calculating the average correlation coefficient $\bar{r}_i$ of wafer (i) is given by:

$$\bar{r}_i = \frac{1}{(m-1)}\sum_{j=1, j \neq i}^{m} r_{i,j}$$

In an embodiment the average correlation coefficients of the respective entities are then compared (S7) with one or more threshold values. When the values of one or more of the correlation coefficients are lower than the threshold value, it is determined that the entity set lacks consistency.

Figure 6:
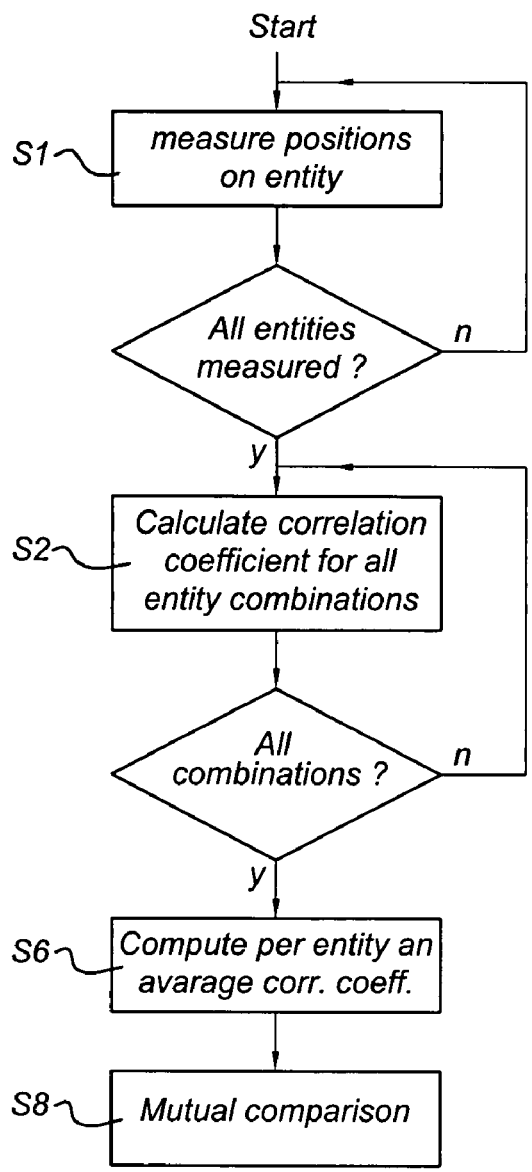

In another embodiment (shown in FIG. 6) the comparison with one or more threshold values is replaced by a comparison (S8) with each other. In this case, after having performed the above calculations, the average correlation coefficients are compared with each other in order to determine the extent of consistency within the entity set. For instance, visualizing the average correlation coefficients for all entities in the entity set, in this example plotting the correlation coefficients of each wafer in the lot, in a graphical representation makes it easier for an operator to visually pinpoint an entity or group of entities (for instance a wafer or group of wafers having a deviating wafer grid (x,y), field shape (z) and/or wafer shape (z)) responsible for bad lot consistency. Also in this case an additional comparison with a threshold value may be performed. The deviations of the respective average correlation value per entity from a threshold value, preferably the overall mean value of the correlation coefficients, may be used as indication of the consistency in the set of entities.

Figure 7A:
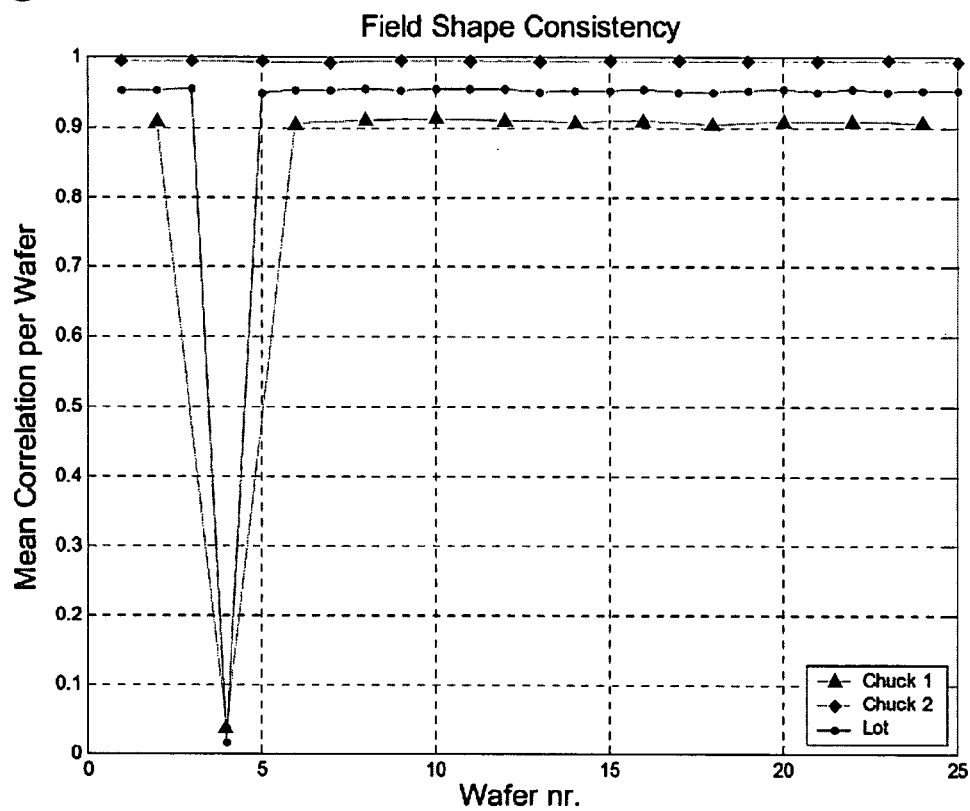
FIG. 7A is an example of a graphical representation of the mean correlation as a function of the wafer number for the lot, the first support table and the second support table.
Figure 7B:
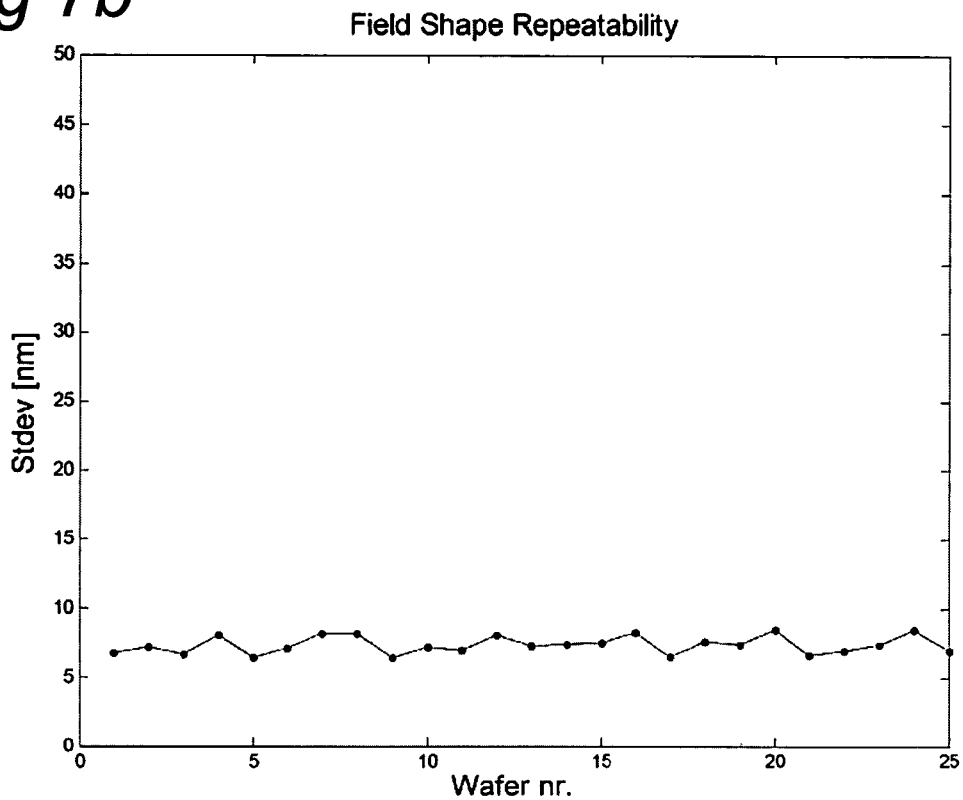
FIG. 7B is a graphical representation of the standard deviation (a) as function of the wafer number.

In the following two examples are given of the characterization of the consistency between a plurality of entities, in this case a plurality of wafers in a lot of 25 wafers. A first part of the wafers of the lot is measured while being seated on a first support table (chuck), while the remaining wafers are measured when they are seated in the second support table of a lithographic device as described herein. FIG. 7A shows a graphical representation of the mean correlation coefficient $r_i$ (with i=1-25) as a function of the wafer number (i), while FIG. 7B shows the standard deviation of the measured position data per wafer. Clearly the wafers handled by the second support table (chuck 2, i.e., wafers 1, 3, 5, 7, . . . , 25) show a good correlation, with correlation coefficient values of more than 0.95. However, the correlation coefficients of the wafers handles by the first support table (chuck 1, i.e., wafers 2, 4, 6, . . . , 24) show a dip at wafer 8. The correlation coefficient drops from a value of about 0.95 to about 0.6. The same effect is present in the curve associated with the correlation coefficients of all wafers (i.e., the wafers of the lot). When for instance the threshold value is chosen at the level of 0.90, then from the measurement results can be easily derived that only wafer 8 cannot be considered consistent with the rest of the wafers.

The determination of the correlation coefficients and the comparison of the correlation coefficients with a threshold value is as such sufficient to characterize the consistency of the set. However, from this information alone it is difficult and sometimes even impossible to determine the cause of any lack of consistency. If information about the standard deviation (field repeatability) is calculated as well, this may be helpful to determine the cause of the inconsistency of wafer 8. In the example the defect of wafer 8 is caused by a large focus spot as a result of the presence of a small particle between the wafer and the support table. The small particle causes an artifact in one field of the wafer only. This is directly reflected in the rise of the standard deviation of wafer 8, as is shown in FIG. 7B.

Figure 8A:
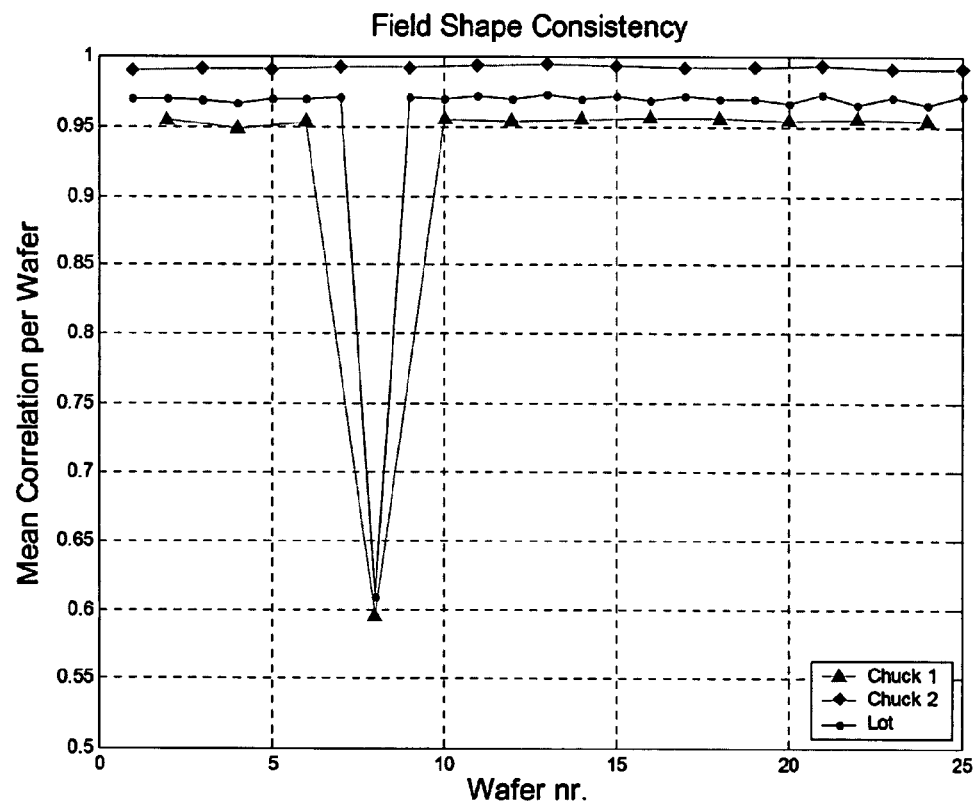
FIG. 8A is another example of a graphical representation of the mean correlation as a function of the wafer number for the lot, the first support table and the second support table.
Figure 8B:
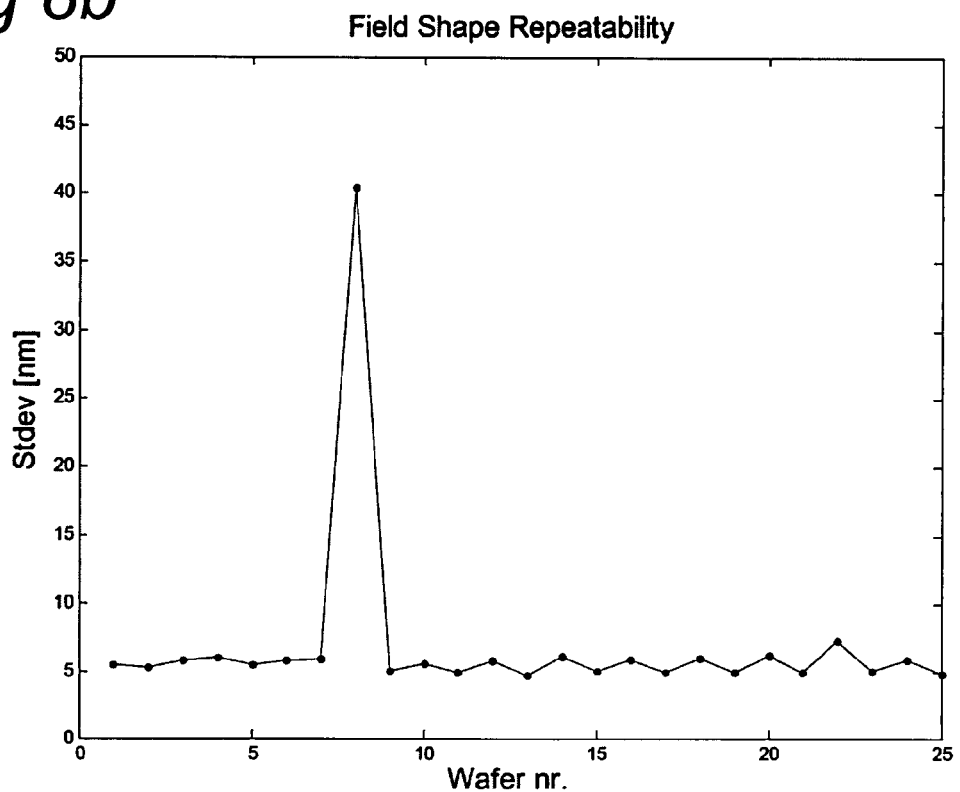
FIG. 8B is a graphical representation of the standard deviation (a) as function of the wafer number of the example shown in FIG. 8A.

In FIGS. 8A and 8B similar graphical representations of the average correlation coefficient per wafer and the standard deviation per wafer for another example are given. Again the wafers handled by the second substrate table (chuck 2) show a good correlation with values of the average correlation coefficients of more than 0.99. However, the average correlation coefficients for the wafers of the first chuck (and of course of the lot) show a dip at the fourth wafer (wafer 4). The average correlation coefficient of wafer 4 is clearly below the threshold value of 0.90 and hence wafer 4 is not consistent with the other wafers of the lot. However, the curve of the standard deviations shown in FIG. 8B remains more or less flat, indicating that the inconsistency of wafer 4 may have been caused by another phenomenon than was the case in the example of FIGS. 7A and 7B.

In the present example the wafer defect was caused by a defective layer structure (layer-stack). Since the defect was not restricted to a small area but instead was present over at least a large part of the wafer surface, the standard deviation of the measured position data of wafer 4 proved to be in the same order of magnitude as the standard deviations belonging to the other wafers of the lot. Therefore FIG. 8B does not show a similar rise of the standard deviation of the position data of wafer 4 as was the case in the first example.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of characterizing the similarity between a plurality of entities in a set of entities, comprising:

measuring position data ($Z_i(j)$) at a plurality of measurement points (j) per entity (i), wherein an entity is selected from a group consisting of substrate layers, substrate fields, and substrates and wherein each position data ($Z_i(j)$) comprises at least one of: a height position at a measurement point (j) or a lateral position of the measurement point (j);

computing a correlation coefficient for each of a plurality of combinations of entities from the entity set, the correlation coefficients being based on the position data ($Z_i(j)$) and being representative of the correlation between the associated combination of entities; and comparing the correlation coefficients to a threshold amount to determine the extent of similarity between the entities.

2. Method as claimed in claim 1, wherein the correlation coefficient of a combination of entities is based on the differences between the position data and the mean value of the position data of each of the entities.

3. Method as claimed in claim 1, wherein the combination of entities is a pair of entities.

4. Method as claimed in claim 1, wherein each position data ($Z_i(j)$) comprises the height position at the measurement point (j).

5. Method as claimed in claim 1, wherein each measurement point (j) comprises an alignment mark or reference mark and wherein each position data ($Z_i(j)$) comprises the lateral position of the measurement point (j).

6. Method as claimed in claim 1, wherein measuring comprises measuring the position data with a sensor.

7. Method of characterizing the consistency between a plurality of entities in a set of entities, comprising:

determining position data ($Z_i(j)$) at a plurality of measurement points (j) per entity (i), wherein an entity is selected from the group consisting of substrate layers, substrate fields, and substrates and wherein each position data ($Z_i(j)$) comprises at least one of: a height position at a measurement point (j) or a lateral position of the measurement point (j);

computing for each entity in the entity set a correlation coefficient with respect to every other entity in the entity set, the correlation coefficients being based on the position data ($Z_i(j)$) and being representative of the correlation between the associated combination of entities;

determining an average value of the computed correlation coefficients, the average value providing a measure of the consistency.

8. Method as claimed in claim 7, further comprising determining one average value of all computed correlation coefficients and comparing the average value with a threshold value to determine the extent of consistency in the entity set.

9. Method as claimed in claim 7, further comprising determining per entity an average value of the computed correlation coefficient with respect to every other entity in the entity set and comparing with each other the determined average values to determine the extent of consistency within the entity set.

10. Method as claimed in claim 9, further comprising determining from the average correlation coefficients whether the correlation coefficients of one or more entities deviate more than a predetermined threshold amount from the correlation coefficients of the other entities.

11. Method as claimed in any claim 7, wherein the correlation coefficient of a combination of entities is based on the differences between the position data and the mean value of the position data of each of the entities.

12. Method as claimed in claim 11, wherein the combination of entities is a pair of entities.

13. Method as claimed in claim 1 or 7, wherein computing the correlation coefficient for each of a plurality of combinations comprises computing a correlation coefficient ($r_{1,2}$) between a first entity with a position data $Z_i(j)$ and a second entity with a position data $Z_2(j)$ based on:

$$r_{1,2} = \frac{\sum_{j=1}^{n}[(Z_1(j)-\overline{Z}_1)(Z_2(j)-\overline{Z}_2)]}{\sqrt{\sum_{j=1}^{n}(Z_1(j)-\overline{Z}_1)^2 \sum_{j=1}^{n}(Z_2(j)-\overline{Z}_2)^2}}$$

wherein $$\overline{Z} = \frac{1}{n}\sum_{j=1}^{n}Z(j)$$

and n is the total number of measurement points.

14. Method as claimed in claim 7, wherein determining the average value of the correlation coefficients of the entity set comprises calculating:

$$\overline{r} = \frac{2}{m(m-1)}\sum_{i=1}^{m-1}\sum_{j=i+1}^{m}r_{i,j},$$

wherein m is a total number of entities.

15. Method as claimed in claim 7, wherein determining the average value of the correlation coefficient of entity (i) in the entity set comprises calculating:

$$\overline{r}_i = \frac{1}{(m-1)}\sum_{j=1,j\neq i}^{m}r_{i,j},$$

wherein m is a total number of entities.

16. Method as claimed in claim 1 or 7, wherein the entities are substrates to be processed by a projection device and the entity set comprises substrates from a lot that are to be subjected to the same operations in the projection device.

17. Method as claimed in claim 1 or 7, wherein the entities are substrates to be processed by a projection device and the entity set comprises substrates to be carried by the same support table of the projection device.

18. Method as claimed in claim 1 or 7, wherein the entities are fields of at least one substrate to be processed by a projection device and the entity set comprises the fields from said at least one substrate.

19. Method as claimed in claim 1 or 7, wherein the entities are layers of a substrate to be processed by a projection device and the entity set comprises the layers of the substrate.

20. Method as claimed in claim 1 or 7, wherein the positions correspond to positions of structures printed on the substrate in a lithographic production process.

21. Method as claimed in claim 20, wherein the structures comprise alignment marks.

22. Method as claimed in claim 20, wherein the structures comprise portions of a microelectronic device.

23. Method as claimed in claim 22, wherein the microelectronic device is selected from the group consisting of integrated circuits, integrated optical systems, magnetic domain memories, liquid crystal displays and/or thin film magnetic heads.

24. Method as claimed in claim 1 or 7, wherein the position data are residual data.

25. Computer arrangement comprising a processor for performing arithmetical operations, and a non-transitory memory, the computer arrangement being configured to communicate with a at least one position sensor for determining positions at a plurality of measurement points (j) on a substrate for providing position data ($Z_i(j)$) and the processor being arranged to read and execute programming lines stored in the non-transitory memory providing the processor with the functionality to perform any of the method recited in any of claim 1 or 7.

26. Computer program product comprising instructions and data store on a non-transitory memory to allow a processor to run a predetermined program in accordance with any one of the method recited in any of claim 1 or 7.

27. Method as claimed in claim 7, wherein each position data ($Z_i(j)$) comprises the height position at the measurement point (j).

28. Method as claimed in claim 7, wherein each measurement point (j) comprises an alignment mark or reference mark and wherein each position data ($Z_i(j)$) comprises the lateral position of the measurement point (j).

29. Method as claimed in claim 7, wherein measuring comprises measuring the position data with a sensor.

30. A lithographic apparatus, comprising:
   at least one position sensor configured to measure position data ($Z_i(j)$) at a plurality of measurement points (j) per entity (i), wherein an entity is selected from a group consisting of substrate layers, substrate fields and substrates and wherein each position data ($Z_i(j)$) comprises at least one of: a height position at a measurement point (j) or a lateral position of the measurement point (j);
   a processor and a memory, the memory comprising program lines for causing the processor to:
   compute a correlation coefficient for each of a plurality of combinations of entities from the entity set, the correlation coefficients being based on the position data ($Z_i(j)$) and being representative of the correlation between the associated combination of entities; and
   compare the correlation coefficients to a threshold amount to determine the extent of similarity between the entities.

31. A lithographic apparatus comprising:
   at least one position sensor configured to measure position data ($Z_i j$)) at a plurality of measurement points (j) per entity (i), wherein an entity is selected from a group consisting of substrate layers, substrate fields and substrates and wherein each position data ($Z_i(j)$) comprises at least one of: a height position at a measurement point (j) or a lateral position of the measurement point (j);
   a processor and a memory, the memory comprising program lines for causing the processor to:
   compute for each entity in the entity set a correlation coefficient with respect to every other entity in the entity set, the correlation coefficients being based on the position data ($Z_i(j)$) and being representative of the correlation between the associated combination of entities; and
   determine an average value of the computed correlation coefficients, the average value providing a measure of the consistency.

* * * * *